US012711362B2

(12) United States Patent
Yun et al.

(10) Patent No.: US 12,711,362 B2
(45) Date of Patent: Aug. 18, 2026

(54) ELECTRONIC DEVICE AND METHOD FOR CONTROLLING ELECTRONIC DEVICE

(71) Applicant: SAMSUNG ELECTRONICS CO., LTD., Suwon-si (KR)

(72) Inventors: Jeongin Yun, Suwon-si (KR); Sungpill Choi, Seoul (KR); Jonghun Lee, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 1311 days.

(21) Appl. No.: 17/527,305

(22) Filed: Nov. 16, 2021

(65) Prior Publication Data

US 2022/0147806 A1 May 12, 2022

Related U.S. Application Data

(63) Continuation of application No. PCT/KR2021/012448, filed on Sep. 14, 2021.

(30) Foreign Application Priority Data

Nov. 9, 2020 (KR) ........................ 10-2020-0148619

(51) Int. Cl.

*G06N 3/0495* (2023.01)
*G06F 7/544* (2006.01)
*H03M 7/24* (2006.01)

(52) U.S. Cl.

CPC ......... *G06N 3/0495* (2023.01); *G06F 7/5443* (2013.01); *H03M 7/24* (2013.01); *G06F 2207/4824* (2013.01)

(58) Field of Classification Search

CPC .. G06N 3/0495; G06F 7/49936–49947; G06F 7/5443; G06F 2207/3816–382;

(Continued)

(56) References Cited

U.S. PATENT DOCUMENTS 10,643,297 B2 5/2020 Mellempudi et al.
11,328,015 B2 5/2022 Mangnall et al.

(Continued)

FOREIGN PATENT DOCUMENTS

CN 110780845 A 2/2020
CN 111178508 A 5/2020

(Continued)

OTHER PUBLICATIONS

International Search Report (PCT/ISA/210) and Written Opinion (PCT/ISA/237) dated Dec. 16, 2021 issued by the International Searching Authority in International Application No. PCT/KR2021/012448.

(Continued)

*Primary Examiner* — Matthew D Sandifer
(74) *Attorney, Agent, or Firm* — Sughrue Mion, PLLC

(57) ABSTRACT

An electronic device and a method for controlling are provided. The electronic device may include a memory storing first input data and first weight data used in operations of a neural network model and a processor configured to input the first input data and the first weight data into a first module, and acquire second input data and second weight data, where a part of the first input data is truncated, and where a part of the first weight data is truncated, input the second input data and the second weight data into a second module that performs multiplication operations, and acquire first output data, and based on scaling factors of the first input data and first weight data identified through the first module, convert the acquired first output data into a floating point form expressing a first bit as a unit scale and acquire second output data.

14 Claims, 11 Drawing Sheets

(58) Field of Classification Search
CPC ... G06F 2207/4824; H03M 7/24; H03M 7/30; H03M 7/3059
See application file for complete search history.

(56) References Cited

U.S. PATENT DOCUMENTS

| | | | | |
|---|---|---|---|---|
| 11,461,614 | B2 | 10/2022 | Baum et al. | |
| 2018/0322607 | A1* | 11/2018 | Mellempudi | G06N 3/0464 |
| 2019/0122100 | A1 | 4/2019 | Kang et al. | |
| 2020/0050963 | A1 | 2/2020 | Tanaka et al. | |
| 2020/0073912 | A1 | 3/2020 | Hiroi et al. | |
| 2020/0097816 | A1 | 3/2020 | Wu et al. | |
| 2020/0117981 | A1 | 4/2020 | Arthur et al. | |
| 2020/0160161 | A1 | 5/2020 | Yoo et al. | |
| 2020/0210839 | A1 | 7/2020 | Lo et al. | |
| 2020/0234126 | A1 | 7/2020 | Covell et al. | |
| 2021/0110508 | A1* | 4/2021 | Mellempudi | G06N 3/092 |
| 2021/0263993 | A1* | 8/2021 | Urbanski | G06F 7/5443 |

FOREIGN PATENT DOCUMENTS

| | | | | |
|---|---|---|---|---|
| GB | 2580160 | A * | 4/2020 | H03M 7/24 |
| KR | 1020190043849 | A | 4/2019 | |
| KR | 10-2020-0050895 | A | 5/2020 | |
| KR | 10-2451519 | B1 | 10/2022 | |

OTHER PUBLICATIONS

Wang, N., et al., “Training Deep Neural Networks with 8-bit Floating Point Numbers”, NIPS 18: Proceedings of the 32nd International Conference on Neural Information Processing Systems, Dec. 3, 2018, 10 pages.

Communication issued Jun. 11, 2026 by the Korean Ministry of Intellectual Property Office in Korean Patent Application No. 10-2020-0148619.

* cited by examiner

ELECTRONIC DEVICE AND METHOD FOR CONTROLLING ELECTRONIC DEVICE

CROSS-REFERENCE TO RELATED APPLICATIONS

This application is a bypass continuation of International Application No. PCT/KR2021/012448, filed on Sep. 14, 2021 in the Korean Intellectual Property Receiving Office, which is based on and claims priority to Korean Patent Application No. 10-2020-0148619, filed on Nov. 9, 2020, in the Korean Intellectual Property Office, the disclosures of which are incorporated by reference herein in their entireties.

BACKGROUND

1. Field

The disclosure relates to an electronic device and a method for controlling thereof, and more particularly, to an electronic device that effectively performs operations for weights and input data in an artificial intelligence model, and a method for controlling thereof.

2. Description of Related Art

Recently, a voice recognition system utilizing an artificial intelligence system is being used in various fields. An artificial intelligence system is a system where a machine learns, determines, and becomes smarter by itself, unlike conventional rule-based smart systems. An artificial intelligence system shows a more improved recognition rate, and becomes capable of understanding user preference more correctly as it is used more. For this reason, conventional rule-based smart systems are gradually being replaced by deep learning-based artificial intelligence systems.

An artificial intelligence technology includes a technology of performing various kinds of recognition and determination functions by utilizing a machine learning (e.g., deep learning) algorithm, and a machine learning algorithm may refer to an algorithm technology of classifying/learning the characteristics of input data by itself.

For enhancing the accuracy of a machine learning algorithm, more operations were required, and thus a gradually increasing number of multiply-accumulate (MAC) operators were accumulated in a machine learning accelerator. Accordingly, a limit that an area occupied by a logic for performing MAC operations gradually became larger in an accelerator existed.

Also, in the past, various number systems by a floating-point method (e.g., FP64, FP32, etc.) were utilized for enhancing the accuracy of a machine learning algorithm, but a limit that an area occupied by operators and power consumption for performing operations for utilizing such number systems were big existed.

SUMMARY

The disclosure was devised for resolving the aforementioned problems, and the purpose of the disclosure is in providing an electronic device that performing operations between weight data and input data based on an artificial intelligence technology, and a method for controlling thereof.

According to an embodiment of the disclosure, an electronic device may include a memory storing first input data and first weight data used in operations of a neural network model and a processor configured to input the first input data and the first weight data into a first module, and acquire second input data and second weight data, where a part of the first input data is truncated, and where a part of the first weight data is truncated, input the second input data and the second weight data into a second module that performs multiplication operations, and acquire first output data, and based on scaling factors of the first input data and first weight data identified through the first module, convert the acquired first output data into a floating point form expressing a first bit as a unit scale and acquire second output data.

According to another embodiment of the disclosure, a method for controlling an electronic device including a memory storing first input data and first weight data used in operations of a neural network model may include inputting the first input data and the first weight data into a first module and acquiring second input data and second weight data, where a part of the first input data is truncated and where a part of the first weight data is truncated, inputting the second input data and the second weight data into a second module that performs multiplication operations and acquiring first output data, and based on scaling factors of the first input data and first weight data identified through the first module, converting the acquired first output data into a floating point form expressing a first bit as a unit scale and acquiring second output data.

According to the various embodiments of the disclosure as described above, an electronic device can effectively perform an operation between a weight value and input data even in a terminal device including limited resources.

DETAILED DESCRIPTION

Figure 1:
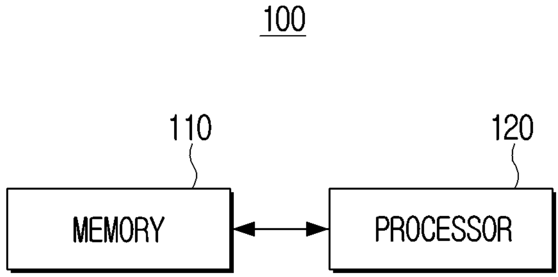
FIG. 1 is a block diagram illustrating a schematic configuration of an electronic device according to an embodiment of the disclosure.

Various modifications may be made to the embodiments of the disclosure, and there may be various types of embodiments. Accordingly, specific embodiments will be illustrated in drawings, and the embodiments will be described in detail in the detailed description. However, it should be noted that the various embodiments are not for limiting the scope of the disclosure to a specific embodiment, but they should be interpreted to include various modifications, equivalents, and/or alternatives of the embodiments of the disclosure. Also, with respect to the detailed description of the drawings, similar components may be designated by similar reference numerals.

Also, in describing the disclosure, in case it is determined that detailed explanation of related known functions or features may unnecessarily confuse the gist of the disclosure, the detailed explanation will be omitted.

In addition, the embodiments described below may be modified in various different forms, and the scope of the technical idea of the disclosure is not limited to the embodiments below. Rather, these embodiments are provided to make the disclosure more sufficient and complete, and to fully convey the technical idea of the disclosure to those skilled in the art.

Also, the terms used in the disclosure are used only to explain specific embodiments, and are not intended to limit the scope of the disclosure. Further, singular expressions include plural expressions, unless defined obviously differently in the context.

In addition, in the disclosure, expressions such as “have,” “may have,” “include,” and “may include” denote the existence of such characteristics (e.g.: elements such as numbers, functions, operations, and components), and do not exclude the existence of additional characteristics.

Also, in the disclosure, the expressions “A or B,” “at least one of A and/or B,” or “one or more of A and/or B” and the like may include all possible combinations of the listed items. For example, “A or B,” “at least one of A and B,” or “at least one of A or B” may refer to all of the following cases: (1) including at least one A, (2) including at least one B, or (3) including at least one A and at least one B.

In addition, the expressions “first,” “second,” and the like used in the disclosure may describe various elements regardless of any order and/or degree of importance. Also, such expressions are used only to distinguish one element from another element, and are not intended to limit the elements.

Meanwhile, the description in the disclosure that one element (e.g.: a first element) is “(operatively or communicatively) coupled with/to” or “connected to” another element (e.g.: a second element) should be interpreted to include both the case where the one element is directly coupled to the another element, and the case where the one element is coupled to the another element through still another element (e.g.: a third element).

In contrast, the description that one element (e.g.: a first element) is “directly coupled” or “directly connected” to another element (e.g.: a second element) can be interpreted to mean that still another element (e.g.: a third element) does not exist between the one element and the another element.

Also, the expression “configured to” used in the disclosure may be interchangeably used with other expressions such as “suitable for,” “having the capacity to,” “designed to,” “adapted to,” “made to,” and “capable of,” depending on cases. Meanwhile, the term “configured to” does not necessarily mean that a device is “specifically designed to” in terms of hardware.

Instead, under some circumstances, the expression “a device configured to” may mean that the device “is capable of” performing an operation together with another device or component. For example, the phrase “a processor configured to perform A, B, and C” may mean a dedicated processor (e.g.: an embedded processor) for performing the corresponding operations, or a generic-purpose processor (e.g.: a central processing unit (CPU) or an application processor) that can perform the corresponding operations by executing one or more software programs stored in a memory device.

Further, in the embodiments of the disclosure, ‘a module’ or ‘a unit’ may perform at least one function or operation, and may be implemented as hardware or software, or as a combination of hardware and software. Also, a plurality of ‘modules’ or ‘units’ may be integrated into at least one module and implemented as at least one processor, excluding ‘a module’ or ‘a unit’ that needs to be implemented as specific hardware.

Meanwhile, various elements and areas in the drawings were illustrated schematically. Accordingly, the technical idea of the disclosure is not limited by the relative sizes or intervals illustrated in the accompanying drawings.

The disclosure relates to an electronic device that truncates adaptive bits respectively for input data and weight data and thereby decreases the size of a module including a logic for performing a multiplication operation between the input data and the weight data, and converts the result value of performing the multiplication operation into a floating point form expressing a first bit as a unit scale and thereby decreases the word size of a buffer storing the result value, and a method for controlling thereof.

Hereinafter, the disclosure will be described in detail with reference to the drawings.

FIG. 1 is a block diagram illustrating a schematic configuration of an electronic device 100 according to an embodiment of the disclosure. As illustrated in FIG. 1, the electronic device 100 may include a memory 110 and a processor 120. Meanwhile, the components illustrated in FIG. 1 are an exemplary diagram for implementing the embodiments of the disclosure, and appropriate hardware and software components of an obvious level to those skilled in the art may additionally be included in the electronic device 100.

Meanwhile, in describing the disclosure, the electronic device 100 is a device that acquires output data for input data by training or compressing a neural network model (or, an artificial intelligence model), or by using a neural network model, and for example, the electronic device 100 may be implemented as a desktop personal computer (PC), a laptop computer, a smartphone, a tablet PC, a server, etc.

Also, various kinds of operations performed by the electronic device 100 may be performed by a system where a clouding computing environment is constructed. For example, a system where a clouding computing environment is constructed may quantize weights included in a neural network model, and perform an operation between quantized data and input data.

The memory 110 may store instructions or data related to at least one other component of the electronic device 100. Also, the memory 110 may be accessed by the processor 120, and reading/recording/correcting/deleting/updating, etc. of data by the processor 120 may be performed.

In the disclosure, the term memory may include a memory 110, a read-only memory (ROM) (not shown) and a random access memory (RAM) (not shown) inside the processor 120, or a memory card (not shown) (e.g., a micro secure digital (SD) card, a memory stick) installed on the electronic device 100. Also, in the memory 110, programs and data, etc. for constructing various kinds of screens to be displayed in a display area of the display may be stored.

In addition, the memory 110 may include a non-volatile memory that can maintain stored information even if power supply is stopped, and a volatile memory that needs constant power supply for maintaining stored information. For example, a non-volatile memory may be implemented as at least one of a one time programmable ROM (OTPROM), a programmable ROM (PROM), an erasable and programmable ROM (EPROM), an electrically erasable and programmable ROM (EEPROM), a mask ROM, or a flash ROM, and a volatile memory may be implemented as at least one of a dynamic RAM (DRAM), a static RAM (SRAM), or a synchronous dynamic RAM (SDRAM). The volatile memory may be implemented in a form of being included in the processor 120 as a component of the processor 120, but this is merely an embodiment, and the volatile memory may be implemented as a separate component from the processor 120.

The memory 110 may store weight data used in operations of a neural network model. That is, the memory 110 may store a plurality of weight data included in a plurality of layers constituting a neural network model. The weight data may include a plurality of weight values included in the weight data. Also, the weight data may be data implemented based on integers, and it may be expressed through at least one of vectors, matrices, or tensors.

The memory 110 may store input data in various types. For example, the memory 110 may store voice data input through a microphone, and image data or text data, etc. input through an input part (e.g., a camera, a keyboard, etc.). Input data stored in the memory 110 may include data received through an external device.

Weight data and input data may respectively include sign data. Sign data may refer to data where the size of each data is not changed and only a value indicating a sign is included. In case specific data is a positive number, sign data may be implemented as 0, and in case specific data is a negative number, sign data may be implemented as 1. However, the disclosure is not limited thereto, and the sign of each data may be expressed in various ways.

The memory 110 may store data necessary for a first module, a second module, a third module, and a fourth module to perform various kinds of operations. Data necessary for the first module, the second module, the third module, and the fourth module to perform various kinds of operations may be stored in a non-volatile memory. Explanation about each module will be made in the following descriptions.

The memory 110 may include a buffer (or, an accumulation buffer) storing output data converted into a floating point form expressing a first bit as a unit scale.

The processor 120 may be electronically connected with the memory 110, and control the overall operations and functions of the electronic device 100. The processor 120 may include one or a plurality of processors to control the operations of the electronic device 100.

The processor 120 may load data necessary for the first module, the second module, the third module, and the fourth module to perform various kinds of operations from a non-volatile memory to a volatile memory. Loading means an operation of calling data stored in a non-volatile memory into a volatile memory and storing the data, so that the processor 120 can access the data.

The processor 120 may perform an operating action between input data and first weight data by using each module. Each operation of the processor 120 will be described in detail with reference to FIG. 2 to FIG. 6B.

Figure 2:
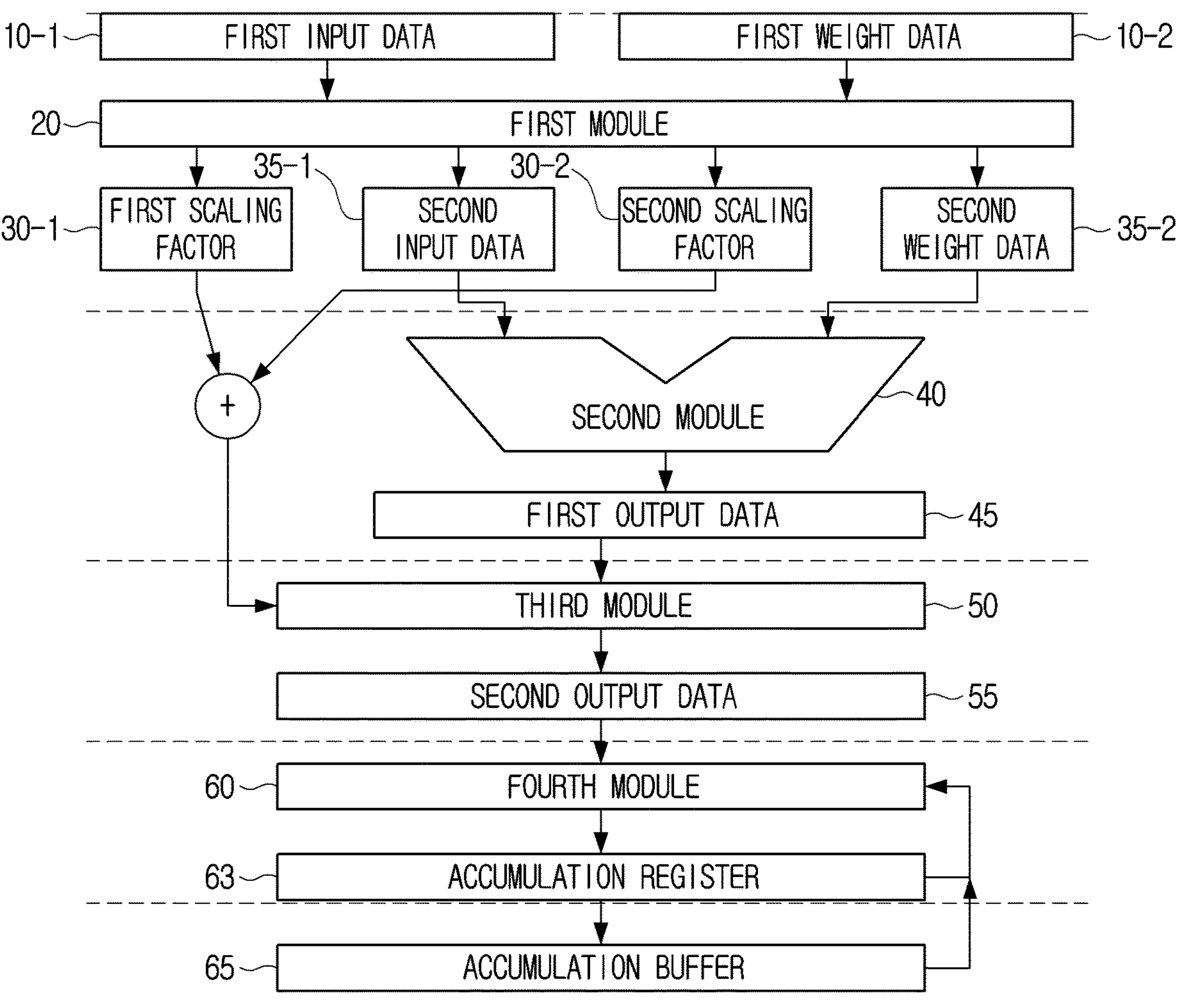
FIG. 2 is a diagram for illustrating a structure and an operation of an electronic device of performing an operation between input data and weight data according to an embodiment of the disclosure.

As illustrated in FIG. 2, the processor 120 may input first input data 10-1 and first weight data 10-2 into the first module 20 and acquire second input data 35-1 and second weight data 35-2, where part of the first input data is truncated.

In FIG. 2, the first module 20 is implemented as one module where both of the first input data 10-1 and the first weight data 10-2 are input, but this is merely an embodiment. The first module 20 may be divided into a module outputting the second input data 35-1 by using the first input data 10-1 and a module outputting the second weight data 35-2 by using the input first weight data 10-2. That is, the first module 20 may be divided into separate modules where the first input data 10-1 and the first weight data 10-2 are respectively input. The first module 20 may also be expressed as an adaptive truncation module.

Meanwhile, the first module 20 may perform operations of identifying the highest bit including an effective value in a higher second bit based on the most significant bit (MSB) excluding the sign data of input data (e.g., the first input data and/or the first weight data), and based on the identified highest bit, identifying a scaling factor indicating a lower bit to be truncated based on the least significant bit (LSB) of the input data, and removing part of the input data based on the identified scaling factor.

Figure 3A:
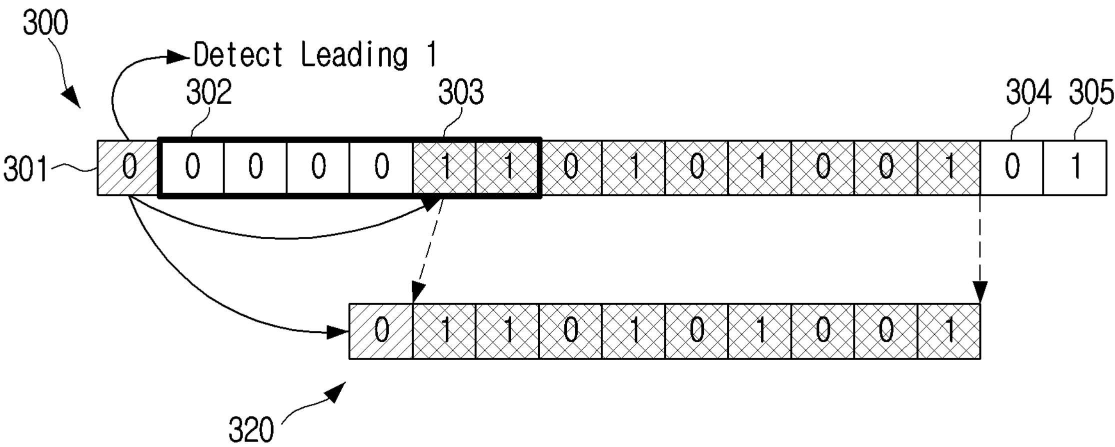
FIG. 3A is a diagram for illustrating a process where an electronic device truncates part of input data and weight data according to an embodiment of the disclosure.

For example, referring to FIG. 3A, the first module 20 may identify the highest bit including an effective value in the higher second bit based on the MSB 302 of the input data 300. Here, the MSB 302 of the input data 300 may refer to the highest bit excluding the sign data 301. Also, the input data 300 may be one of the first input data 10-1 or the first weight data 10-2.

As an example, the sign data 301 of the input data 300 is 0, and thus the first module 20 may identify that the input data 300 is a positive number. Then, the first module 20 may identify the highest bit including an effective value in the higher second bit (e.g., bit 6) based on the MSB 302. As the input data 300 is a positive number, the effective value may be 1. That is, the first module 20 may detect the highest bit including 1 (leading 1) in the higher second bit based on the MSB.

Figure 3B:
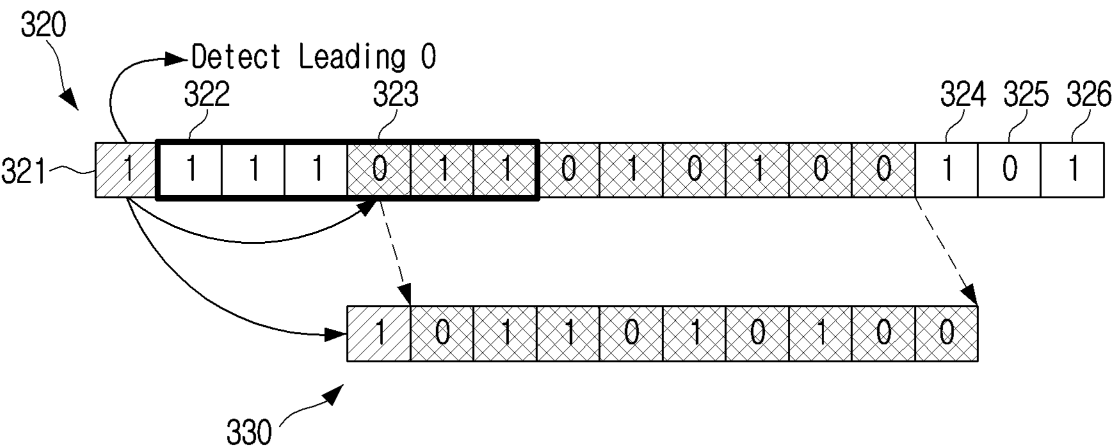
FIG. 3B is a diagram for illustrating a process where an electronic device truncates part of input data and weight data according to an embodiment of the disclosure.

As another example, referring to FIG. 3B, as the sign data 301 of the input data 320 is 1, the first module 20 may identify that the input data 320 is a negative number. Then, the first module 20 may identify the highest bit including an effective value in the higher second bit (e.g., bit 6) based on the MSB 322. As the input data 320 is a negative number, the effective value may be 0. That is, the first module 20 may detect the highest bit including 0 (leading 0) in the higher second bit based on the MSB.

Through the first module 20, the processor 120 may identify a first highest bit including an effective value in the second bit of the first input data 10-1, identify a third bit located further than the first highest bit in the second bit, and identify the difference between the second bit and the third bit as a first scaling factor 30-1 corresponding to the first input data 10-1. Here, the first scaling factor may refer to the number of truncated data bits based on the LSB of the first input data 10-1. For example, in case bit 2 was removed based on the LSB of the first input data, the scaling factor is 2.

For example, as illustrated in FIG. 3A, a case where the second bit is bit 6 is assumed. The processor 120 may identify the first highest bit including an effective value in the higher bit 6 based on the MSB 302 of data which is a 16 bit input through the first module 20 (e.g., the first input data 10-1) 300. When the first highest bit 303 including an effective value is identified, the processor 120 may identify the third bit located further than the first highest bit 303 excluding the sign data (e.g., the 4 bits including 0 between the sign data 301 and the first highest bit 303). Through the first module 20, the processor 120 may identify 2 which is a number corresponding to 2 bits which is the difference between the second bit (e.g., bit 6) and the third bit (bit 4) as the first scaling factor.

As another example, as illustrated in FIG. 3B, a case where the second bit is bit 6 is assumed. The processor 120 may identify the first highest bit including an effective value in the higher bit 6 based on the MSB 332 of data which is a 16 bit input through the first module 20 (e.g., the first input data 10-1) 320. When the first highest bit 323 including an effective value is identified, the processor 120 may identify the third bit located further than the first highest bit 323 excluding the sign data (e.g., the 3 bits including 0 between the sign data 301 and the first highest bit 323). Through the first module 20, the processor 120 may identify 3 which is a number corresponding to bit 3 which is the difference between the second bit (e.g., bit 6) and the third bit (bit 3) as the first scaling factor.

Through the first module 20, the processor 120 may process the first weight data 10-2 in the same manner as processing the first input data 10-1. Through the first module 20, the processor 120 may identify a second highest bit including an effective value in the second bit of the first input data 10-1, identify a fourth bit located further than the second highest bit in the second bit, and identify the difference between the second bit and the fourth bit as a second scaling factor 30-2 corresponding to the first weight data 10-2. Here, the second scaling factor may refer to the number of truncated data bits based on the LSB of the first weight data 10-2.

Through the first module 20, the processor 120 may truncate data corresponding to the third bit and data corresponding to the first scaling factor in the first input data 10-1 and acquire second input data. For example, referring to FIG. 3A, it is assumed that the input data 300 which is a positive number is the first input data 10-1. The processor 120 may truncate the third bit which is 4 bits including 0 between the sign data 301 and the first highest bit 303, and truncate data which is 2 bits 304, 305 corresponding to the first scaling factor (e.g., 2), and acquire second input data 320. That is, through the first module 20, the processor 120 may convert the first input data which is 16 bits into the second input data which is 10 bits.

Through the first module 20, the processor 120 may truncate data corresponding to the fourth bit and data corresponding to the second scaling factor in the first weight data and acquire second weight data. For example, referring to FIG. 3B, it is assumed that the input data 320 which is a negative number is the first weight data 10-2. The processor 120 may truncate the fourth bit which is 3 bits including 1 between the sign data and the second highest bit 323, and truncate data which is 3 bits 324, 325, 326 corresponding to the second scaling factor (e.g., 3), and acquire second weight data 330. That is, through the first module 20, the processor 120 may convert the first weight data which is 16 bits into the second weight data which is 10 bits.

Meanwhile, the second bit may be a predetermined value through an experiment or a research, etc. As another example, the second bit may be changed according to the type of a result to be output through the neural network model. Specifically, the processor 120 may identify the type of an operation result to be output through the neural network model. The processor 120 may identify an operation accuracy necessary for outputting the result of the identified type. Then, as the identified operation accuracy is higher, the processor 120 may determine the size of the second bit as a first value, and as the identified operation accuracy is lower, the processor 120 may determine the size of the second bit as a second value that is larger than the first value.

For example, accuracy of an operation necessary for performing a classification operation such as an object recognition operation may be lower than accuracy of an operation necessary for performing a regression operation such as a super-resolution operation. Accordingly, in case the neural network model performs a classification operation, the processor 120 may determine the size of the second bit as 8 bits, and in case the neural network model performs a regression operation, the processor 120 may determine the size of the second bit as 4 bits. Here, the number determined as the size of the second bit may be a result output through a research or an experiment.

The processor 120 may adjust the number of bits to be adaptively truncated based on an operation accuracy necessary for outputting a result of a specific type through the neural network model, and thereby reduce the amount of power consumed for an operation.

Referring to FIG. 2, the processor 120 may input the second input data 35-1 and the second weight data 35-2 into the second module 40 performing multiplication operations and acquire first output data 45. The second module 40 may be implemented as a hardware module including a logic for performing multiplication operations, and it may be expressed as a multiplication operation module. However, this is merely an embodiment, and the second module 40 may also be implemented as a software module.

Many algorithms that were previously known were generally trained while being quantized as 16 bits which is a number system based on a CPU or a graphics processing unit (GPU) provided in a machine learning framework. In case an environment used at the time of training (a hyper-parameter) cannot be figured out correctly, a problem occurs in that it is rather difficult to perform more optimized quantization for such algorithms. Accordingly, in a conventional hardware accelerator, an operator for performing an operation of data based on 16 bits, etc. had to be included. For example, in case the input data 10-1 and the first weight data 10-2 were respectively 16 bits, a logic for performing 16 bit×16 bit was included in a module for performing multiplication operations. Also, in the case of a module performing multiplication operations, if the number of bits of data to perform a multiplication operation increases, area complexity may increase in proportion to the square of the increased bits.

In the case of the disclosure, the processor 120 may reduce the size of the second module 40 performing multiplication operations by adaptively truncating bits for each of the first input data 10-1 and the first weight data 10-2. For example, in case the first input data 10-1 and the first weight data 10-2 which are 16 bits were converted into the second input data 35-1 and the second weight data 35-2 which are 10 bits through the first module 20, the second module may perform an operation even if it includes only a logic for performing 10 bit×10 bit. Accordingly, the area occupied by the second module performing multiplication operations and power consumed for performing multiplication operations may be reduced.

The processor 120 may sum up the scaling factors of each of the first input data 10-1 and the first weight data 10-2 identified through the first module 20 and acquire a third scaling factor, and input the third scale value and the first output data 45 into the third module 50 and output second output data 55. Here, the third module 50 may be expressed as a scale transformation module.

Specifically, the processor 120 may sum up the first scaling factor 30-1 corresponding to the first input data 10-1 and the second scaling factor 30-2 corresponding to the second input data 10-2 and acquire a third scaling factor. Then, based on the third scaling factor, the processor 120 may convert the acquired first output data into a floating point form (e.g., a quantum floating point form) expressing the first bit as a unit scale and acquire second output data. For example, through the third module 50, the processor 120 may acquire the second output data 55 based on the third scaling factor and the first output data 45.

The third module 50 is a module that converts the third scaling factor into a unit scale form, truncates a lower fifth bit based on the LSB in the first output data based on the converted unit scale, and adds a guard bit as far as the truncated fifth bit and outputs the second output data. That is, the third module 50 is a module that converts the first output data into a quantum floating point form by using the first output data and the third scaling factor. A quantum floating point form will be described in detail with reference to FIG. 4.

Figure 4:
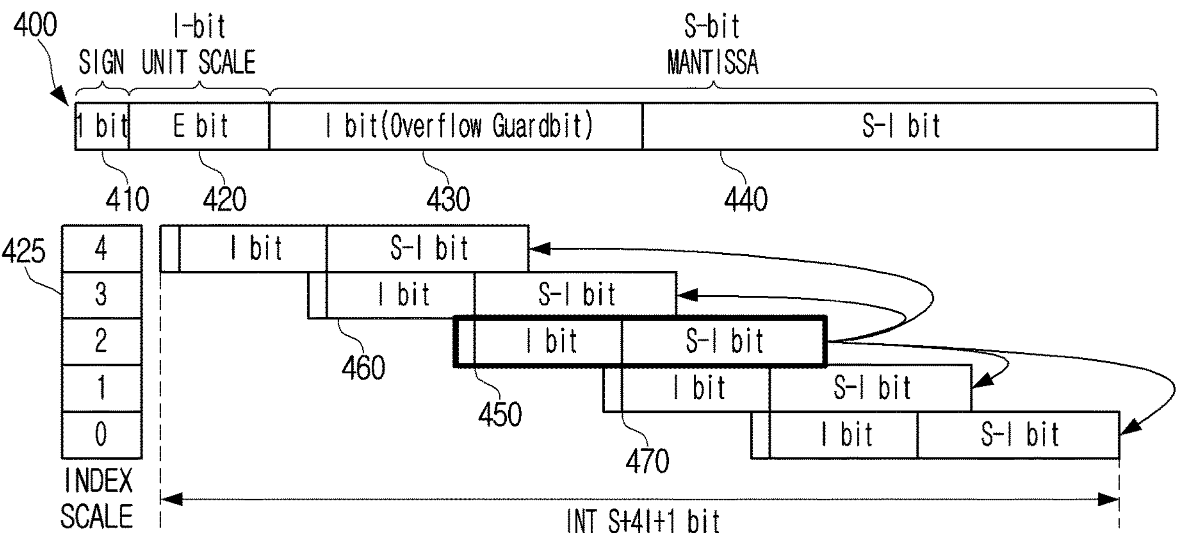
FIG. 4 is a diagram for illustrating a floating point form expressing a first bit as a unit scale according to an embodiment of the disclosure.

According to an embodiment of the disclosure, as illustrated in FIG. 4, a quantum floating point form may refer to a form where a scale is converted (or, expressed) in the unit of the first bit (e.g., I (I is an integer) bit), and a mantissa part has a structure as a conventional fixed point. An index scale 425 may refer to a scale where a conventional scale was converted into the unit of the first bit.

For example, if data expressed based on an integer or based on another number system is converted (or, expressed) into a quantum floating point form, it may be expressed as 400. The converted data 400 may include 1 bit for the sign data 410, E (E is an integer) bit(s) indicating the index scale 425, and S (S is an integer) bit(s) indicating the mantissa part. The mantissa part may include a guard bit which is I bit for preparing for occurrence of an overflow and S-I bit(s) for expressing an effective number, etc.

For example, a case where the first bit is bit 8 is assumed. If the index scale of the first data 450 increases by one scale, the scale of the first bit 450 may move as much as 8 bits, and the data may be converted (or, expressed) into the second data 460. As another example, if the index scale of the first data 450 decreases by one scale, the scale of the first data 450 may move as much as 8 bits and the data may be converted (or, expressed) into the second data 460. Also, for example, in case E bit that may indicate an index scale is 3 bits, and the index scale may have a scale of 0-4, a range of S+4I+1 may be expressed based on an integer.

As an example, a case where the first bit is bit 8, and the third scaling factor is 5 is assumed. Through the third module 50, the processor 120 may identify that the third scaling factor (e.g., 5) is not expressed in a unit of a multiple of the first bit. Here, through the third module 50, the processor 120 may identify the minimum number (e.g., 8) among numbers that are larger than the third scaling factor value and that may be expressed in a unit of a multiple of the first bit. Here, as one unit scale is 8 bits, if the identified minimum number (e.g., 8) is converted into an index scale, it may be 1. Through the third module 50, the processor 120 may convert the third scaling factor into an index scale corresponding to the identified minimum number, and based on the converted minimum number, truncate the lower fifth bit based on the LSB in the first output data, and add a guard bit as much as the truncated fifth bit and output the second output data.

Here, the lower fifth bit may refer to a bit that is located in a lower area based on the LSB in the S-I bit indicating an effective number. For example, if the index scale of the third scaling factor is changed from 5 to 1, the processor 120 may truncate a bit located lower than the higher bit 4 based on the MSB in the mantissa part of 19 bits (or, a lower bit 15 based on the LSB in the mantissa part) (the fifth bit). Then, the processor 120 may add a guard bit as far as the fifth bit to the left part of the remaining higher 4 bits.

As illustrated in FIG. 2, the processor 120 may input the second output data 55 and the third output data stored in the buffer (or, the accumulation buffer) 65 into the fourth module 60 and acquire fourth output data where the second output data and the third output data were added.

The fourth module 60 may be expressed as a quantum floating (QF) adder module. The fourth module 60 is a module that identifies a scaling factor in a larger size between the first unit scaling factor of the second output data 55 and the second unit scaling factor of the third output data, aligns the unit scales of the second output data and the third output data as the identified scaling factor in a larger size, and adds the second output data and the third output data of which unit scales were aligned and outputs the fourth output data. An embodiment in this regard will be described in detail with reference to FIG. 5A and FIG. 5B.

Figure 5A:
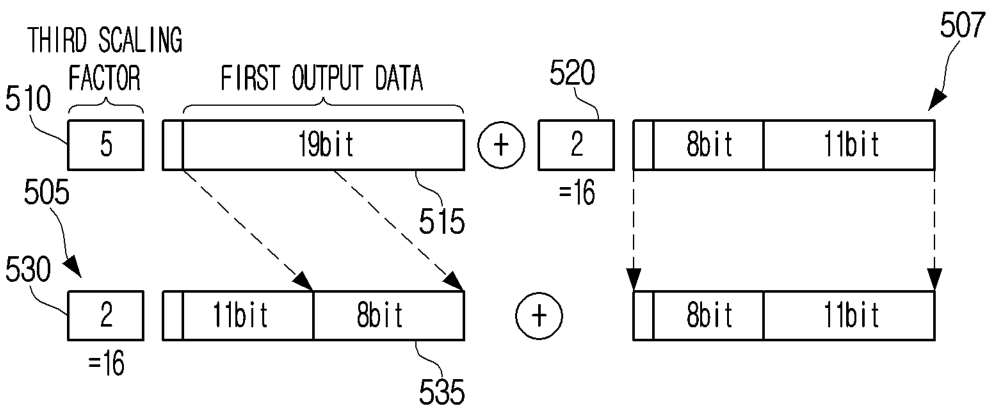
FIG. 5A is a diagram for illustrating an operation of an electronic device of performing addition between output data according to an embodiment of the disclosure.
Figure 5B:
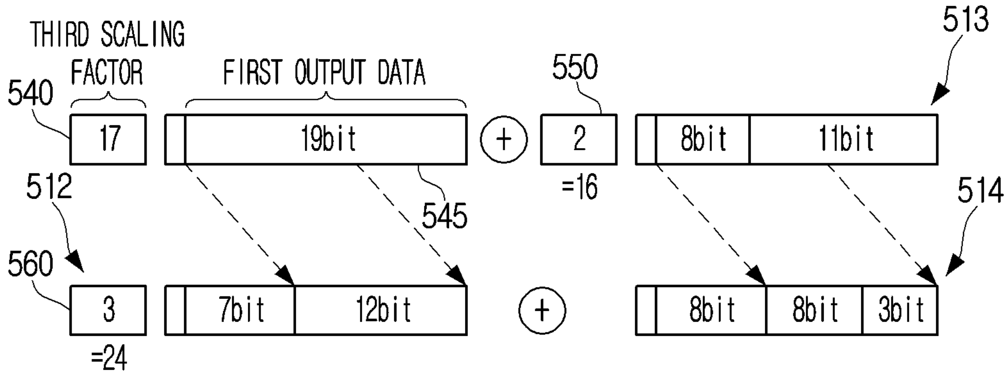
FIG. 5B is a diagram for illustrating an operation of an electronic device of performing addition between output data according to an embodiment of the disclosure.

According to an embodiment of the disclosure, FIG. 5A and FIG. 5B are diagrams for illustrating a process where the first output data is converted into the second output data and an addition operation is performed with the third output data stored in the buffer.

According to another embodiment of the disclosure, as illustrated in FIG. 5A, the processor 120 may input the third scaling factor 510 and the first output data 515 into the third module 50 and acquire the second output data. The processor 120 may input the second output data and the third output data 507 into the fourth module 60 and acquire the fourth output data.

The processor 120 may identify a unit scaling factor in a larger size between the first unit scaling factor (or, the first index scale) of the second output data and the second unit scaling factor 520 of the third output data 507 through the fourth module 60.

For example, as the third scaling factor 510 of the first output data was converted into the first unit scaling factor (e.g., 1), the first unit scaling factor is smaller than the second unit scaling factor. Accordingly, the processor 120 may align the unit scaling factors of the second output data and the third output data as the unit scaling factor in a larger size (e.g., 2) identified through the fourth module 60.

For example, the processor 120 may convert the first unit scaling factor of the second output data from 1 into 2 which is identical to the second unit scaling factor through the fourth module 60. Then, through the fourth module 60, the processor 120 may acquire the second output data 505 which was aligned to suit the converted unit scaling factor. In case the mantissa part of the first output data was 19 bit, the processor 120 may align the first unit scaling factor as 2 through the fourth module 60, truncate the remaining bits excluding the higher bit 8 based on the MSB of the mantissa part, and add bit 11 as a guard bit.

Then, the processor 120 may acquire the fourth output data where the second output data and the third output data of which unit scales were aligned through the fourth module 60.

As another embodiment of the disclosure, referring to FIG. 5B, the processor 120 may input the third scaling factor 540 and the first output data 545 into the third module 50 and acquire the second output data 512. The processor 120 may input the second output data 512 and the third output data 513 into the fourth module 60 and acquire the fourth output data.

The processor 120 may identify a unit scaling factor in a larger size between the first unit scaling factor (or, the first index scale) 560 of the second output data 512 and the second unit scaling factor 550 of the third output data 513 through the fourth module 60. As the first scaling factor 540 of the first output data was converted into the first unit scaling factor (e.g., 3), the first unit scaling factor is larger than the second unit scaling factor (e.g., 2).

Accordingly, the processor 120 may align the unit scaling factors of the second output data and the third output data as the scaling factor in a larger size (e.g., 3) identified through the fourth module 60. For example, the processor 120 may convert the second unit scaling factor of the third output data from 2 to 3 which is identical to the first unit scale through the fourth module 60. Then, the processor 120 may acquire the third output data 514 of which unit scaling factor was aligned based on the unit scaling factor converted through the fourth module 60. Then, the processor 120 may acquire the fourth output data where the second output data and the third output data of which unit scales were aligned through the fourth module 60 were added.

The processor 120 may normalize the acquired fourth output data to be converted into a floating point form expressing the first bit as a unit scale, and store the normalized data in the buffer 65. Specifically, after the processor 120 temporarily stores the acquired fourth output data in a register 63, the processor 120 may perform control such that the data is stored in the buffer 65. The register means a space where various kinds of instructions performed by the processor 120, and data which are subjects of instructions are temporarily maintained or stored.

Figure 6A:
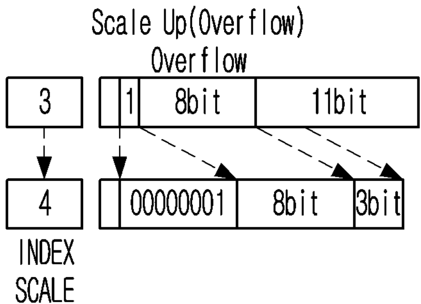
FIG. 6A is a diagram for illustrating an operation of an electronic device of performing normalization for output data according to an embodiment of the disclosure.

For example, as illustrated in FIG. 6A, in case an overflow occurred while the second output data and the third output data were added, the processor 120 may increase the index scale by 1 (e.g., from 3 to 4). Then, the processor 120 may remove the lower bit 8 based on the LSB in the bit 11 in the mantissa part.

Figure 6B:
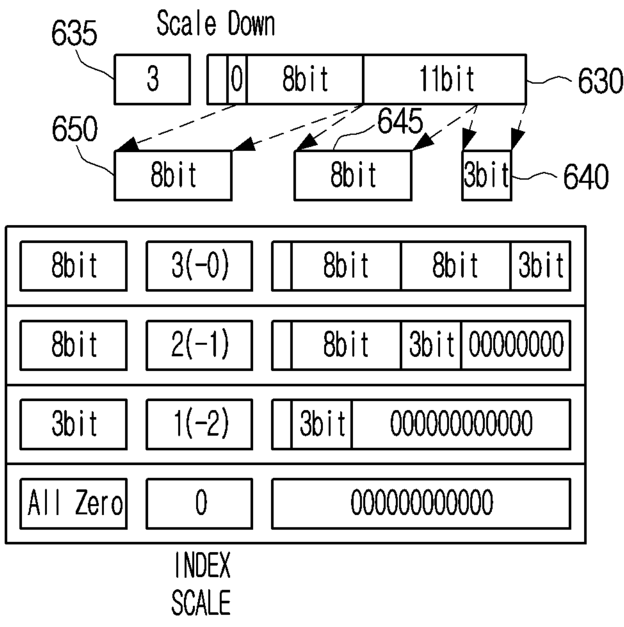
FIG. 6B is a diagram for illustrating an operation of an electronic device of performing normalization for output data according to an embodiment of the disclosure.

As another example, as illustrated in FIG. 6B, when the fourth output data 630 is a positive number, in case all the parts located further based on the MSB of the mantissa part are 0, or when the fourth output data 630 is a negative number, in case all the parts located further based on the MSB of the mantissa part are 1, the index scale 635 of the fourth output data 630 corresponding thereto should be reduced. Specifically, by detecting 0 or 1 in a block unit, the processor 120 may determine whether to reduce the index scaling factor.

For example, a case where the fourth output data 630 is a positive number is assumed. If 1 is detected in the first block 650 of the fourth output data, the processor 120 may maintain the index scale. If initial 1 (or, leading 1) is detected in the second block 645 of the fourth output data, the processor 120 may reduce the index scale by 1. If initial 1 is detected in the third block 640, the processor 120 may reduce the index scale by 2. If 1 is not detected even in the third block 640, the processor 120 may identify the fourth output data as 0.

As another embodiment of the disclosure, the processor 120 may adjust the index scale based on whether initial 1 is detected in the first block 650 in the fourth output data 630. For example, if a case where the fourth output data 630 is a positive number is assumed, if initial 1 is not detected in the first block 650, the processor 120 may reduce the index scale by 1, and if initial 1 is detected in the first block 650, the processor 120 may maintain the index scale. Meanwhile, in case the fourth output data 630 is a negative number, the processor 120 may adjust the index scale based on whether initial 0 is detected in the first block 650 in the fourth output data 630.

When an operation is performed in a neural network model, there are few cases where a drastic scale change occurs. Even if the processor 120 adjusts the index scale based on whether initial 1 or initial 0 is detected only in the first block 650, accuracy does not fall drastically. Accordingly, the electronic device 100 may reduce the size of the area occupied by the module performing a normalization operation by performing a normalization operation using only the first block of the fourth output data 630.

The processor 120 may reduce the number of bits by converting the first output data into a quantum floating point form. Then, the processor 120 may store the fourth output data acquired by performing an addition operation between data of which bit numbers were reduced in the buffer, and thereby reduce the word size of the buffer.

That is, the processor 120 may reduce the sizes of the areas occupied by each module and reduce power consumption by adaptively truncating bits of data, and performing an addition operation based on data converted into a quantum floating point form.

Figure 7:
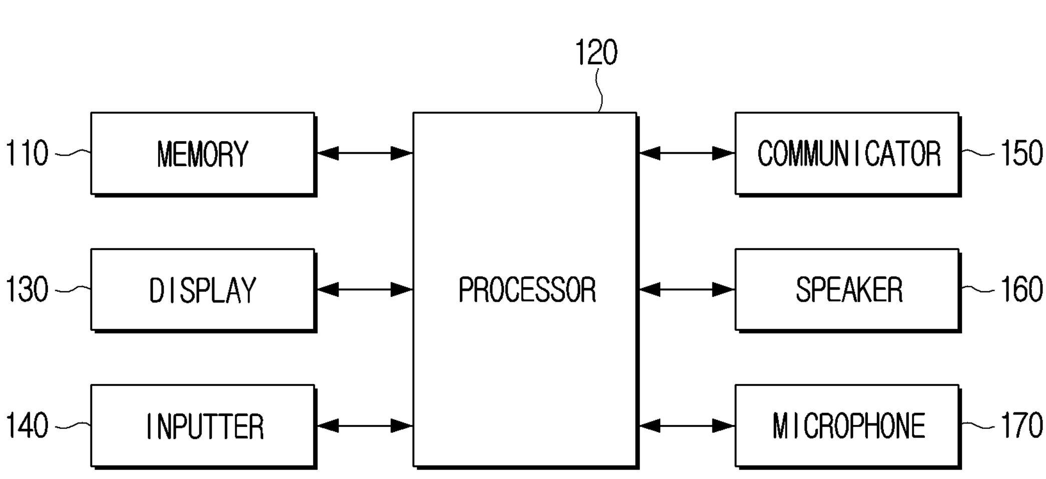
FIG. 7 is a block diagram illustrating a detailed configuration of an electronic device according to an embodiment of the disclosure.

FIG. 7 is a block diagram illustrating a detailed configuration of the electronic device 100 according to an embodiment of the disclosure. As illustrated in FIG. 7, the electronic device 100 may include a memory 110, a processor 120, a display 130, an inputter 140, a communicator 150, a speaker 160, and a microphone 170. As explanation regarding the memory 110 and the processor 120 was described above, overlapping explanation will be omitted.

The display 130 may display various information according to control by the processor 120. In particular, the display 130 may display the first input data, or display the fourth output data that was acquired by performing an operation between weight data and input data. Here, displaying the fourth output data may include an operation of displaying a screen where a text or an image generated based on the fourth output data is included. That is, the display 130 may display a result output through the neural network model.

The display 130 may be implemented as various display technologies such as a a liquid crystal display (LCD), organic light emitting diodes (OLED), an active-matrix organic light-emitting diode (AM-OLED), liquid crystal on silicon (LcoS), or digital light processing (DLP), etc. Also, the display 130 may be combined with at least one of the front surface area, the side surface area, or the rear surface area of the electronic device 100 in the form of a flexible display.

The inputter 140 may include a circuit, and receive a user input for controlling the electronic device 100. In particular, in the inputter 140, a touch panel for receiving an input of a user touch using a user's hand or a stylus pen, etc., buttons for receiving an input of a user manipulation, etc. may be included. As another example, the inputter 140 may be implemented as another input device (e.g., a keyboard, a mouse, a motion inputter, etc.). Meanwhile, the inputter 140 may receive the first input data input from a user or receive inputs of various kinds of user instructions.

The communicator 150 may include a circuit, and perform communication with an external device. Here, connection of communication between the communicator 150 and an external device may include performing communication via a third device (e.g., a repeater, a hub, an access point, a server, or a gateway, etc.).

The communicator 150 may include various communication modules for performing communication with an external device. As an example, the communicator 150 may include a wireless communication module, and for example, it may include a cellular communication module using at least one of 5th Generation (5G), Long-Term Evolution (LTE), LTE-Advanced (LTE-A), code division multiple access (CDMA), wideband CDMA (WCDMA), etc.

As another example, a wireless communication module may include, for example, at least one of wireless fidelity (WiFi), Bluetooth, Bluetooth low energy (BLE), Zigbee, radio frequency (RF), or a body area network (BAN). However, this is merely an embodiment, and the communicator 150 may include a wired communication module.

The communicator 150 may receive various kinds of first input data from an external device communicatively connected with the electronic device 100. For example, the communicator 150 may receive various kinds of first input data from an input device that is connected with the electronic device 100 via wireless communication (e.g., a camera, a microphone, a keyboard, etc.) or an external server that can provide various kinds of contents.

The speaker 160 is a component that outputs various kinds of audio data for which various processing jobs such as decoding or amplification, and noise filtering were performed by an audio processor (not shown). Also, the speaker 160 may output various kinds of notification sounds or voice messages.

For example, the speaker 160 may output a notification sound notifying that an operation result between weight data and input data (e.g., the fourth output data or a text or an image generated based on the fourth output data) was acquired by a neural network model.

The microphone 170 is a component that can receive an input of a voice from a user. The microphone 170 may be provided inside the electronic device 100, but it may also be provided outside and electronically connected with the electronic device 100. Also, in case the microphone 170 is provided outside, the microphone 170 may transmit a user voice signal generated through a wired/wireless interface (e.g., Wi-Fi, Bluetooth) to the processor 120.

The microphone 170 may receive an input of a user voice including a wake-up word (or, a trigger word) that can activate an artificial intelligence model consisting of various kinds of artificial neural networks. If a user voice including a wake-up word is input through the microphone 170, the processor 120 may activate an artificial intelligence model and perform an operation between weight data by using the user voice as the first input data.

Meanwhile, functions related to artificial intelligence according to the disclosure are operated through the processor 120 and the memory 110. The processor 120 may consist of one or a plurality of processors. Here, the one or plurality of processors may be generic-purpose processors like CPUs, application processors (APs), and digital signal processors (DSPs), graphic-dedicated processors like GPUs and vision processing units (VPUs), or artificial intelligence-dedicated processors like neural processing units (NPUs).

The one or plurality of processors 120 perform control such that input data is processed according to a predefined operation rule stored in the memory 110 or an artificial intelligence model. Alternatively, in case the one or plurality of processors are artificial intelligence-dedicated processors, the artificial intelligence-dedicated processors may be designed as a hardware structure specified for processing of a specific artificial intelligence model.

A predefined operation rule or an artificial intelligence model is characterized in that it is made through learning. Here, being made through learning may mean that a basic artificial intelligence model is trained by using a plurality of learning data by a learning algorithm, and a predefined operation rule or an artificial intelligence model set to perform a desired characteristic (or, purpose) is made. Such learning may be performed in a device where artificial intelligence is performed itself according to the disclosure, or performed through a separate server and/or system.

As examples of learning algorithms, there are supervised learning, unsupervised learning, semi-supervised learning, or reinforcement learning, but learning algorithms are not limited to the aforementioned examples.

An artificial intelligence model may include a plurality of artificial neural networks, and the artificial neural networks may consist of a plurality of layers. Each of the plurality of neural network layers has a plurality of weight values, and performs a neural network operation through an operation between the operation result of the previous layer and the plurality of weight values. The plurality of weight values included by the plurality of neural network layers may be optimized by the learning result of the artificial intelligence model. For example, the plurality of weight values may be updated such that a loss value or a cost value acquired at the artificial intelligence model during a learning process is reduced or minimized.

As examples of an artificial neural network, there are a convolutional neural network (CNN), a deep neural network (DNN), a recurrent neural network (RNN), a restricted Boltzmann machine (RBM), a deep belief network (DBN), a bidirectional recurrent deep neural network (BRDNN), and deep Q-networks, etc., and the artificial neural network in the disclosure is not limited to the aforementioned examples excluding cases clearly specified.

Figure 8:
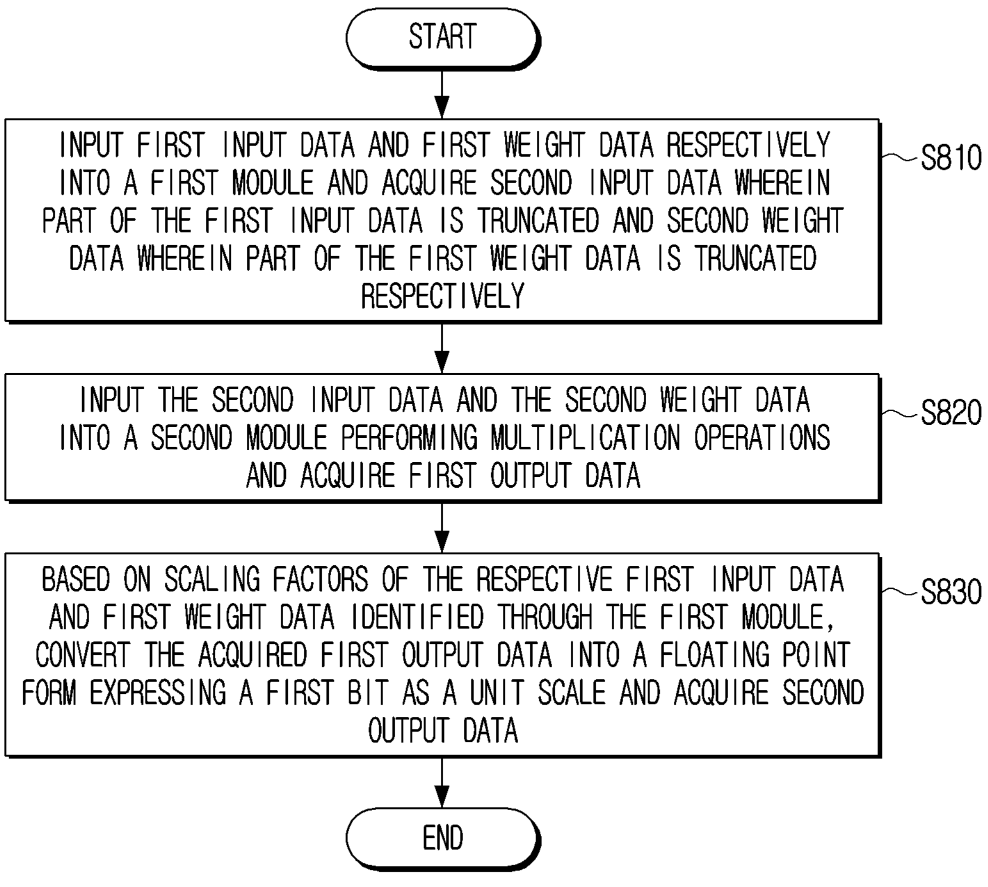
FIG. 8 is a flowchart for illustrating a method for controlling an electronic device according to an embodiment of the disclosure.

FIG. 8 is a flowchart for illustrating a method for controlling the electronic device 100 according to an embodiment of the disclosure.

The electronic device 100 may input first input data and first weight data respectively into a first module and acquire second input data and second weight data, where part of the first input data was truncated and where part of the first weight data was truncated respectively in operation S810.

Specifically, based on the MSB of input data, the electronic device 100 may identify the highest bit including an effective value in a higher second bit, and based on the identified highest bit, identify a scaling factor indicating a lower bit to be truncated based on the LSB of the input data, and acquire second input data and second weight data by using the first module truncating part of the input data based on the scaling factor.

Meanwhile, through the first module, the electronic device 100 may identify a first highest bit including an effective value in the second bit of the first input data, identify a third bit located further than the first highest bit in the second bit, and identify the difference between the second bit and the third bit as a first scaling factor corresponding to the first input data. As another example, through the first module, the electronic device 100 may identify a second highest bit including an effective value in the second bit of the first weight data, identify a fourth bit located further than the second highest bit in the second bit, and identify the difference between the second bit and the fourth bit as a second scaling factor corresponding to the first weight data.

Then, through the first module, the electronic device 100 may truncate data corresponding to the third bit and data corresponding to the first scaling factor in the first input data and acquire the second input data. As another example, through the first module, the electronic device 100 may truncate data corresponding to the fourth bit and data corresponding to the second scaling factor in the first weight data and acquire the second weight data.

The electronic device 100 may input the second input data and the second weight data into a second module performing multiplication operations and acquire first output data in operation S820.

The electronic device 100 may, based on scaling factors of the respective first input data and first weight data identified through the first module, convert the acquired first output data into a floating point form expressing a first bit as a unit scale and acquire second output data in operation S830.

Specifically, the electronic device 100 may sum up the scaling factors of the respective first input data and first weight data identified through the first module and acquire a third scaling factor. Then, the electronic device 100 may input the third scale value and the first output data into a third module and acquire the second output data. The third module is a module that converts the third scaling factor into a unit scale form, truncates a lower fifth bit based on the LSB in the first output data based on the converted unit scale, and adds a guard bit as much as the truncated fifth bit and outputs the second output data.

The electronic device 100 may input the second output data and third output data prestored in the buffer into a fourth module and acquire fourth output data where the second output data and the third output data were added. Then, the electronic device 100 may normalize the fourth output data to be converted into a floating point form expressing the first bit as a unit scale, and store the normalized data in the buffer.

Meanwhile, methods according to the aforementioned various embodiments of the disclosure may be implemented in forms of applications that can be installed on conventional electronic devices.

Also, the methods according to the aforementioned various embodiments of the disclosure may be implemented just by software upgrade, or hardware upgrade of conventional electronic devices.

Further, it is possible that the aforementioned various embodiments of the disclosure are performed through an embedded server provided on the electronic device or at least one external server.

Meanwhile, according to an embodiment of the disclosure, the aforementioned various embodiments may be implemented as software including instructions stored in machine-readable storage media, which can be read by machines (e.g.: computers). The machines refer to devices that call instructions stored in a storage medium, and can operate according to the called instructions, and the devices may include the electronic device according to the aforementioned embodiments. In case an instruction is executed by a processor, the processor may perform a function corresponding to the instruction by itself, or by using other components under its control.

An instruction may include a code that is generated or executed by a compiler or an interpreter. A storage medium that is readable by machines may be provided in the form of a non-transitory storage medium. Here, the term 'non-transitory' only means that a storage medium does not include signals, and is tangible, but does not indicate whether data is stored in the storage medium semi-permanently or temporarily. For example, 'a non-transitory storage medium' may include a buffer where data is temporarily stored.

Also, according to an embodiment of the disclosure, the methods according to the aforementioned various embodiments may be provided while being included in a computer program product. A computer program product refers to a product, and it can be traded between a seller and a buyer. A computer program product can be distributed in the form of a storage medium that is readable by machines (e.g.: a compact disc read only memory (CD-ROM)), or distributed on-line through an application store (e.g.: Play Store™). In the case of on-line distribution, at least a portion of a computer program product may be stored in a storage medium such as the server of the manufacturer, the server of the application store, and the memory of the relay server at least temporarily, or may be generated temporarily.

In addition, each of the components (e.g.: a module or a program) according to the aforementioned various embodiments may be comprised of a single entity or a plurality of entities, and some sub-components among the aforementioned sub-components may be omitted, or different sub-components may be further included in the various embodiments. Alternatively or additionally, some components (e.g.: modules or programs) may be integrated into one entity to perform the same or similar functions performed by each component prior to integration. Operations performed by a module, a program, or another component according to the various embodiments may be performed sequentially, in parallel, repetitively, or in a heuristic manner, or at least some operations may be performed in a different order, omitted, or a different operation may be added.

While preferred embodiments of the disclosure have been shown and described, the disclosure is not limited to the aforementioned specific embodiments, and it is apparent that various modifications may be made by those having ordinary skill in the technical field to which the disclosure belongs, without departing from the gist of the disclosure as claimed by the appended claims. Also, it is intended that such modifications are not to be interpreted independently from the technical idea or prospect of the disclosure.

What is claimed is:

1. An electronic device comprising:
- a memory storing first input data and first weight data used in operations of a neural network model; and
- a processor configured to:
  - input the first input data and the first weight data into a first module implemented as hardware logic, and acquire second input data and second weight data, wherein a part of the first input data is truncated, and wherein a part of the first weight data is truncated,
  - input the second input data and the second weight data into a second module implemented as a hardware module comprising a logic for performing multiplication operations, and acquire first output data, and
  - based on scaling factors of the first input data and the first weight data identified through the first module, convert the acquired first output data into a floating point form expressing a first bit as a unit scale and acquire second output data, wherein the processor is further configured to:

sum up the scaling factors of the first input data and the first weight data identified through the first module and acquire a third scaling factor; and input the third scaling factor and the first output data into a third module implemented as hardware logic and acquire the second output data, wherein the third module is configured to:

convert the third scaling factor into an index scale expressed in units of the first bit;

truncate at least one of lower bits in the first output data based on the index scale; and add a guard bit as far as the truncated lower bits and generate the second output data in the floating point form, and wherein the floating point form comprises:

a sign bit;

an index scale field representing a scale expressed in units of the first bit; and a mantissa field having a fixed-point structure comprising at least one guard bit.

2. The electronic device of claim 1, wherein the processor is further configured to:

through the first module, based on a most significant bit (MSB) of the first input data, identify a highest bit including an effective value in a higher second bit, and, based on the identified highest bit, identify a scaling factor indicating a lower bit to be truncated based on a least significant bit (LSB) of the first input data, and truncate the part of the first input data based on the scaling factor.

3. The electronic device of claim 1, wherein the processor is configured to:

through the first module, identify a first highest bit including an effective value in a second bit of the first input data, identify a third bit located further than the first highest bit, bit, and identify a difference between the second bit and the third bit as a first scaling factor corresponding to the first input data, and through the first module, identify a second highest bit including the effective value in the second bit of the first weight data, identify a fourth bit located further than the second highest bit, and identify a difference between the second bit and the fourth bit as a second scaling factor corresponding to the first weight data.

4. The electronic device of claim 3, wherein the processor is further configured to:

through the first module, truncate data corresponding to the third bit and data corresponding to the first scaling factor in the first input data, and acquire the second input data, and through the first module, truncate data corresponding to the fourth bit and data corresponding to the second scaling factor in the first weight data, and acquire the second weight data.

5. The electronic device of claim 3, wherein the processor is further configured to:

identify a type of a result to be output through the neural network model, identify an operation accuracy necessary for outputting the result of the identified type, and when the identified operation accuracy is high, determine a size of the second bit as a first value, and when the identified operation accuracy is low, determine the size of the second bit as a second value that is larger than the first value.

6. The electronic device of claim 1, wherein the processor is further configured to, through the third module:

convert the third scaling factor into the unit scale form, and based on the converted unit scale form, truncate a lower fifth bit based on the LSB in the first output data, and add a guard bit as far as the truncated fifth bit and output the second output data.

7. The electronic device of claim 1, wherein the memory includes a buffer storing output data, and the processor is further configured to:

input the second output data and third output data prestored in the buffer into a fourth module and acquire fourth output data where the second output data and the third output data were added.

8. The electronic device of claim 7, wherein the processor is further configured to, through the fourth module:

identify a unit scaling factor in a larger size between a first unit scaling factor of the second output data and a second unit scaling factor of the third output data, align unit scales of the second output data and the third output data as the identified unit scaling factor in a larger size, and add the second output data and the third output data of which the unit scaling factors were aligned and output the fourth output data.

9. The electronic device of claim 7, wherein the processor is further configured to:

normalize the acquired fourth output data to be converted into a floating point form expressing the first bit as a unit scale, and store the normalized data in the buffer.

10. A method for controlling an electronic device comprising a memory storing first input data and first weight data used in operations of a neural network model, the method comprising:

inputting the first input data and the first weight data into a first module implemented as hardware logic and acquiring second input data and second weight data, wherein a part of the first input data is truncated and wherein a part of the first weight data is truncated;

inputting the second input data and the second weight data into a second module implemented as a hardware module comprising logic for performing multiplication operations and acquiring first output data; and based on scaling factors of the first input data and the first weight data identified through the first module, converting the acquired first output data into a floating point form expressing a first bit as a unit scale and acquiring second output data, wherein converting the acquired first output data into the floating point form further comprises:

summing up the scaling factors of the first input data and the first weight data identified through the first module and acquiring a third scaling factor; and inputting the third scaling factor and the first output data into a third module implemented as hardware logic and acquiring the second output data, wherein the third module is configured to:

convert the third scaling factor into an index scale expressed in units of the first bit;

truncate at least one of lower bits in the first output data based on the index scale; and add a guard bit as far as the truncated lower bits and generate the second output data in the floating point form, and wherein the floating point form comprises:

a sign bit;

an index scale field representing a scale expressed in units of the first bit, and a mantissa field having a fixed-point structure comprising at least one guard bit.

11. The controlling method of claim 10, further comprising, through the first module, based on a most significant bit (MSB) of the first input data, identifying a highest bit including an effective value in a higher second bit, and based on the identified highest bit, identifying a scaling factor indicating a lower bit to be truncated based on a least significant bit (LSB) of the first input data, and truncating the part of the first input data based on the scaling factor.

12. The controlling method of claim 10, wherein the acquiring second input data and second weight data comprises:

through the first module, identifying a first highest bit including an effective value in a second bit of the first input data, identifying a third bit located further than the first highest bit, and identifying a difference between the second bit and the third bit as a first scaling factor corresponding to the first input data; and through the first module, identifying a second highest bit including the effective value in the second bit of the first input data, identifying a fourth bit located further than the second highest bit, and identifying a difference between the second bit and the fourth bit as a second scaling factor corresponding to the first weight data.

13. The controlling method of claim 12, wherein the acquiring second input data and second weight data comprises:

through the first module, truncating data corresponding to the third bit and data corresponding to the first scaling factor in the first input data and acquiring the second input data; and through the first module, truncating data corresponding to the fourth bit and data corresponding to the second scaling factor in the first weight data and acquiring the second weight data.

14. The controlling method of claim 12, further comprising:

identifying a type of a result to be output through the neural network model;

identifying an operation accuracy necessary for outputting the result of the identified type; and when the identified operation accuracy is high, determining a size of the second bit as a first value, and when the identified operation accuracy is low, determining the size of the second bit as a second value that is larger than the first value.

* * * * *